United States Patent [19]

Gutierrez et al.

[11] Patent Number: 4,498,225

[45] Date of Patent: Feb. 12, 1985

[54] METHOD OF FORMING VARIABLE SENSITIVITY TRANSMISSION MODE NEGATIVE ELECTRON AFFINITY PHOTOCATHODE

[75] Inventors: William A. Gutierrez; Herbert L. Wilson, both of Woodbridge, Va.

[73] Assignee: The United States of America as represented by the Secretary of the Army, Washington, D.C.

[21] Appl. No.: 522,768

[22] Filed: Oct. 20, 1983

Related U.S. Application Data

[62] Division of Ser. No. 260,959, May 6, 1981.

[51] Int. Cl.[3] .............................................. H01L 31/18

[52] U.S. Cl. ...................................... 29/572; 148/171; 148/175; 313/342; 313/373; 313/346 R; 427/77; 357/30

[58] Field of Search ...................... 29/572; 427/74, 77; 357/30; 313/373, 346 R, 384-386, 542; 148/175, 171

[56] References Cited

U.S. PATENT DOCUMENTS

| | | | |
|---|---|---|---|
| 3,672,992 | 6/1972 | Schaefer | 427/74 |
| 3,673,011 | 6/1972 | Strull | 148/1.5 |
| 3,696,262 | 10/1972 | Antypas | 313/530 |
| 3,699,404 | 10/1972 | Simon et al. | 357/4 |
| 3,814,993 | 6/1974 | Kennedy | 357/30 |
| 3,868,523 | 2/1975 | Klopfer et al. | 313/542 |
| 3,889,143 | 6/1975 | Gowers | 313/542 |
| 3,900,865 | 8/1975 | Schaefer | 357/30 |
| 3,901,745 | 8/1975 | Pion | 148/171 |
| 3,914,136 | 10/1975 | Kressel | 148/171 |
| 3,931,633 | 1/1976 | Shannon et al. | 357/30 |
| 3,932,883 | 1/1976 | Rowland et al. | 357/30 |
| 3,953,880 | 4/1976 | Hara et al. | 357/30 |
| 3,958,143 | 5/1976 | Bell | 313/542 |
| 3,959,037 | 5/1976 | Gutierrez et al. | 148/171 |
| 3,959,038 | 5/1976 | Gutierrez et al. | 148/171 |
| 3,960,620 | 6/1976 | Ettenberg | 148/175 |
| 3,972,060 | 7/1976 | Hara et al. | 357/30 |
| 3,972,750 | 8/1976 | Gutierrez et al. | 148/171 |
| 3,972,770 | 8/1976 | Stein | 156/600 |
| 3,981,755 | 9/1976 | Gowers | 148/171 |
| 4,000,503 | 12/1976 | Matare | 357/16 |
| 4,019,082 | 4/1977 | Olsen et al. | 313/346 R |
| 4,040,074 | 8/1977 | Hara et al. | 357/16 |
| 4,063,276 | 12/1977 | Hara et al. | 357/30 |
| 4,075,654 | 2/1978 | Hara et al. | 357/30 |
| 4,096,511 | 6/1978 | Gurnell et al. | 357/30 |
| 4,099,198 | 7/1978 | Howorth et al. | 357/30 |
| 4,115,223 | 9/1978 | Thrush | 204/129.6 |
| 4,286,373 | 9/1981 | Gutierrez et al. | 29/572 |

*Primary Examiner*—Aaron Weisstuch
*Attorney, Agent, or Firm*—Anthony T. Lane; Milton W. Lee; Max L. Harwell

[57] ABSTRACT

A method of forming a variable sensitivity transmission mode negative electron affinity (NEA) photocathode in which the sensitivity of the photocathode to white or monochromatic light can be varied by varying the backsurface recombination velocity of the photoemitting material with an electric field. The basic structure of the photocathode is comprised of a Group III-V element photoemitter on a larger bandgap Group III-V element window substrate.

5 Claims, 3 Drawing Figures

METHOD OF FORMING VARIABLE SENSITIVITY TRANSMISSION MODE NEGATIVE ELECTRON AFFINITY PHOTOCATHODE

The invention described herein may be manufactured, used, and licensed by the U.S. Government for governmental purposes without the payment of any royalties thereon.

This application is a division of application Ser. No. 260,959, filed May 6, 1981.

BACKGROUND OF THE INVENTION

1. Field of the Invention.

This invention relates to a method of forming a photocathode and more specifically to a method of forming a variable sensitivity transmission mode negative electron affinity (NEA) photocathode and the resulting structure wherein the sensitivity of the photocathode to white or monochromatic light can be varied by varying the backsurface recombination velocity of the photoemitting material with a modulated electric field.

2. Description of the Prior Art.

Efficient electron emission, based upon the concept of NEA, from Cesium or Cesium-Oxygen treated semiconductor surfaces, such as Gallium-Arsenide (GaAs) or other ternary Group III–V element compounds, and Silicon has had a large impact in the area of low light level detection and particularly in scintillation counting, photomultipliers, and imaging devices. These efficient new semiconductor emitters are characterized by their long minority-carrier diffusion lengths and high electron escape probabilities. The emission mechanism involves thermalization of excited electrons, which are produced by photon or other excitation to the conduction band edge with the result that electrons can diffuse distances of several microns before emission. Because of the NEA condition on a heavily p-doped Cesium-Oxygen treated semiconductor surface, electrons within a diffusion length of the surface can efficiently escape into the vacuum.

Photoemitters utilizing NEA have brought to fruition a new family of photocathodes with greatly improved performance. In particular, photocathodes made from Group III–V compound materials, such as GaAs, GaInAs, and InAsP, have shown substantial advantages over conventional photocathodes in increased yield and longer wavelength response when they are operated in the reflection mode. While the developments in incorporating Group III–V materials as reflection mode photoemitters have been impressive, there still remains the need for high performance transmission mode operation which is highly desirable for many light-sensing device applications. This would have the advantage of providing low cost high performance photocathodes for these devices.

The fabrication of an efficient NEA transmission mode photocathode requires that a thin high quality single crystal p-doped semiconductor photoemitter layer, such as GaAs be epitaxially grown on a high quality single crystal substrate material which is different from the photoemitter layer, such as GaP or GaAlAs, in order that the substrate material be transparent for the wavelengths of interest. The fundamental absorption edge occurs at photon energies equal to the bandgap of a material. Thus, for transmission mode cathodes, the bandgap determined by material composition for the substrate must be larger than the bandgap of the emitting layer. There are, however, compromises which can be made in the choice of substrates and photoemissive layers which will allow optimization of response over a range of wavelengths of interest. For example, the choice of GaP as a substrate for a GaAs photoemitter provides broad-band response to about 0.93 microns with a short wavelength cut-off around 0.56 microns. The long wavelength response can be extended beyond 0.93 microns by incorporating Indium into the GaAs to form a lower bandgap GaInAs ternary emitting layer.

There are basically three parameters that have a significant bearing on the sensitivity of a transmission mode NEA photocathode such as GaAs on GaP. These parameters are: (1) the diffusion length, (2) the escape probability, and (3) the minority-carrier recombination velocity at the GaAs-GaP interface. The diffusion length is related to the crystalline perfection and purity of the GaAs layer. The escape probility is related to the degree of NEA at the emitting surface that is brought about by the application of the Cesium-Oxygen activating layer. The backsurface recombination velocity is related to the condition at the interface between the GaAs and GaP and is determined to a degree by the amount and direction of band-bending at this interface. For high sensitivity, parameters (1) and (2) must be large in value while parameter (3) must be low.

SUMMARY OF THE INVENTION

The present invention is comprised of a technique for achieving a variable sensitivity transmission mode NEA photocathode by varying the backsurface recombination velocity of the photoemitter layer, the method of forming the photocathode, and the resulting variable sensitivity NEA photocathode structure. The luminous sensitivity of such a photocathode structure can be varied, in an optimum case, by as much as a factor of three by varying the recombination velocity from approximately $10^7$ cm/second to less than $10^5$ cm/second. The basic structure is preferably comprised of a Group III–V photoemitter on a larger bandgap Group III–V window substrate, but is not limited only to those materials. For example, the photoemitter layer may be made from a Silicon seed crystal and the larger bandgap material may be a Silicon-Oxide transparent insulator layer and a Molybdenum transparent conductor layer. In either of the cases, the window substrate or transparent conductor and insulator layer combinations act as a field plate and a dielectric material through which the electric field is applied and have a wider bandgap than the photoemitter material.

The photoemitter, insulator, and conductor layers are respectively chosen from the group of materials classed as metals, insulators, and semiconductors.

The method of forming the present variable sensitivity photocathode is by vapor phase epitaxial techniques and/or liquid phase epitaxial methods onto appropriate single crystal substrates in which the seed substrate may be either removed from the active region of the cathode if it is not transparent to the wavelengths of interest or the seed substrate may remain as a support window if it is transparent to the appropriate wavelengths.

The method of forming and the resulting photocathode structure can be better understood by referencing the following drawings as explained in the detailed description.

DETAILED DESCRIPTION OF THE PREFERRED EMBODIMENT

Figure 1:
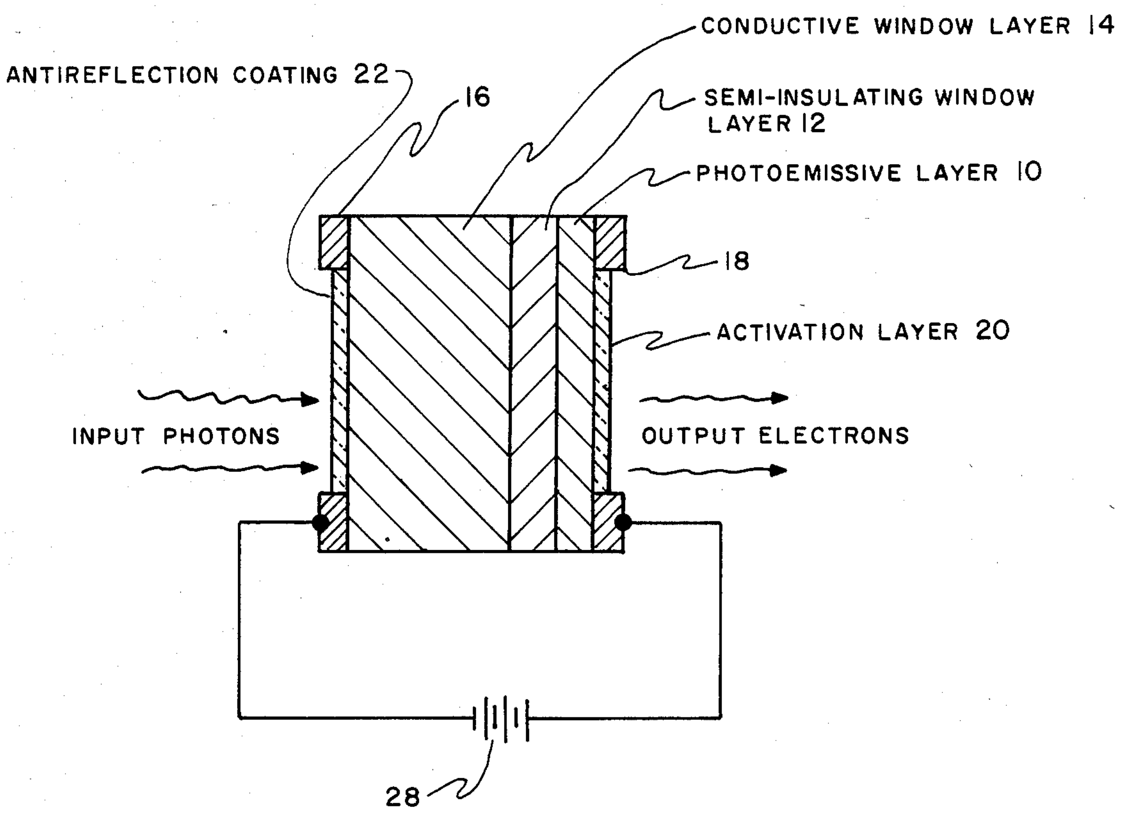
FIG. 1 illustrates the structure of the present variable sensitivity transmission mode NEA photocathode.

Refer to FIG. 1 for a better understanding of the photocathode structure including the method of varying the backsurface recombination velocity. The structure is comprised of an NEA photoemissive single crystalline material layer 10 such as p-doped GaAs, GaInAs, or InAsP, which is epitaxially grown on a semi-insulating layer 12 of window material of extremely high resistivity such as a GaAlAs, a GaP, a GaInP, or a GaAsP layer. Layer 12 is, in turn, epitaxially grown on a low resistivity p- or n-doped conductive window material layer 14 such as GaAlAs, GaP, GaInP, or GaAsP. It is preferable, although not necessary, that layer 12 and layer 14 be made of the same composition material and be different only in resistivity. Layer 12 can be Chromium or Oxygen doped to achieve high resistivity and low diffusion length which are both desirable in this structure so that no electrons can be injected from layer 14 under the necessary biasing conditions. Any injected electrons can be a potential source of undesirable dark current especially in the case where layer 14 is n-doped. In addition, the luminescence efficiency in layer 12 is low and does not contribute significantly to dark current. Layer 12 being an indirect bandgap semiconductor, i.e. GaP, also tends to reduce injection luminescence efficiency. Layers 18 and 16 are electrical contact rings that are applied to the outer periphery of layers 10 and 14 respectively so that the bias supply, represented by numeral 28, can be electrically connected to the photocathode structure. Layer 22 represents an antireflection coating of, for example, Silicon dioxide which may be used to minimize the incident radiation reflection loss. Layer 20 is an activation layer, preferably of Cesium and Oxygen of the order of monolayers in thickness which is applied under ultra high vacuum conditions to the surface of emitting layer 10 to bring about the condition of NEA which provides for high electron escape probability.

The basic operational concept behind the photocathode of this invention is the control of surface recombination velocity at the interface of layers 10 and layer 12 by field effect. Layer 12 acts as an insulator while layer 14 acts as a field plate controlling the band bending at the back surface of layer 10. The physics of operation is analogous to Metal-Insulator-Semiconductor (MIS) operation where layer 14 acts in place of the metal (m), layer 12 acts in place of the usual oxide insualtor (I), and layer 10 is the semiconductor (S). Layer 14 can be biased negative with respect to layer 10 with bias supply 28 in order to create an accumulation region at the back surface of the p-doped layer 10. The creation of this accumulation region bends the bands up at the inteface which has the ultimate effect of lowering the backsurface recombination velocity and significantly increasing the sensitivity of the photoemissive layer. Thus, by modulating the bias supply 28, the sensitivity of the photocathode to white or monochromatic light, i.e. in the 0.6 micron to 0.9 micron bandwidth, can be varied. In addition, the stringent requirements imposed on the condition of the emitting layer - window interface are minimized. This is because the deleterious effect of unfavorable bandbending, leading to high surface recombination velocity, can be overcome with the field effect.

Figure 2:
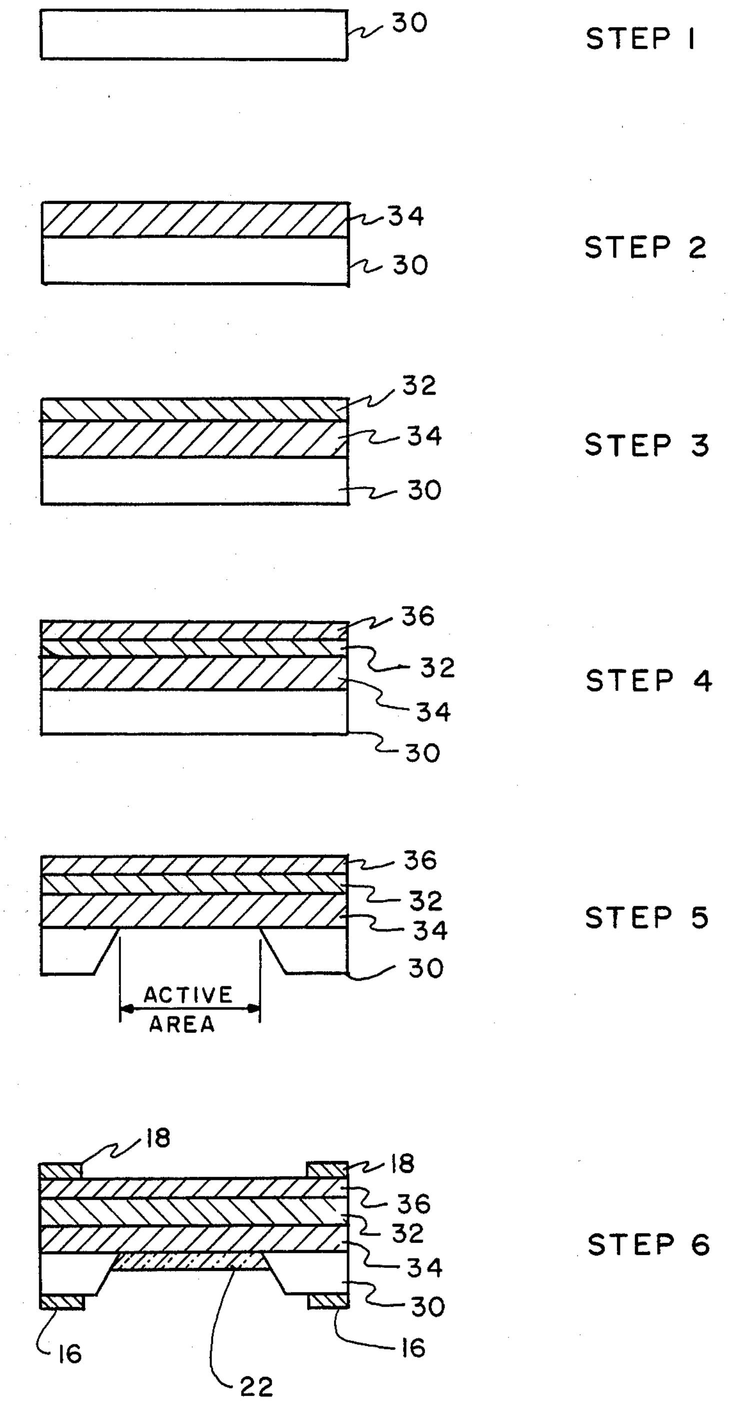
FIG. 2 shows the construction steps of forming a GaAs/GaP NEA photocathode.

Refer to FIG. 2 for an illustration of the step-by-step technique of fabricating a GaAs photoemitting seed crystal layer 30 on a GaP window layer 34 variable sensitivity transmission mode photocathode by the vapor phase epitaxial method.

In step 1, a 15 mil thick (100)-oriented GaAs single crystal seed substrate 30 that is doped p-type with Zinc to $5\times10^{18}$ carriers $cm^{-3}$ polished on the growth surface with a $5H_2SO_4{:}1H_2O_2{:}1H_2O$ etch to remove any work damage introduced during the sawing and lapping of the wafer. In step 2, the substrate is loaded into an open tube vapor phase reactor and a highly Zinc-doped ($1\times10^{19}cm^{-3}$) approximately 50 micron thick layer of GaP 34 is epitaxially grown on the GaAs seed using HCl-Ga-$PH_3$-$H_2$ vapor process. In step 3, an approximately 0.5 micron thick Oxygen or Chromium doped high resistivity ($\geqq 10^{10}$ ohm-cm) GaP layer 32 is epitaxially grown onto 34 using the same vapor process as was used to grow layer 34. In step 4, a Zinc-doped ($5\times10^{18}cm^{-3}$) one micron thick GaAs photoemitting layer 36 is grown epitaxially onto the surface of layer 32 using a (HCl-Ga-$AsH_3$-$H_2$) vapor process. In step 5, an active window area is defined by either removing substrate 30 completely or etching out a ring structure as shown in FIG. 2. In step 6, appropriate contact rings 18 and 16, preferably made of Gold (Au) or Indium (In), are applied to layers 36 and 30 respectively so that electrical contact is available for the application of the biasing field from biasing supply 28. Finally, an appropriate antireflection coating 22, preferably made of $S_1O_2$, $Si_3N_4$, or suitable multilayer composite, is applied to the back of layer 34 to reduce the amount of reflected light from the photon receiving side of the structure.

The type of structure described in this example has the advantage of having all the key materials in single crystalline form which implies high quality optical and electrical properties leading to improved device performance. In addition, all the materials can withstand high temperatures ($\geqq 600°$ C.) with minimal outgassing which allows for ease of activation with Cesium and Oxygen. The activation procedure for this cathode, which is required to bring about a condition of NEA, generally requires that the GaAs layer 36 be heated to approximately 610° C. in vacuum to clean its surface prior to the application of Cesium and Oxygen. This requires that the entire photocathode structure be able to withstand this temperature without degradation. The structure described herein above fulfills this condition.

Figure 3:
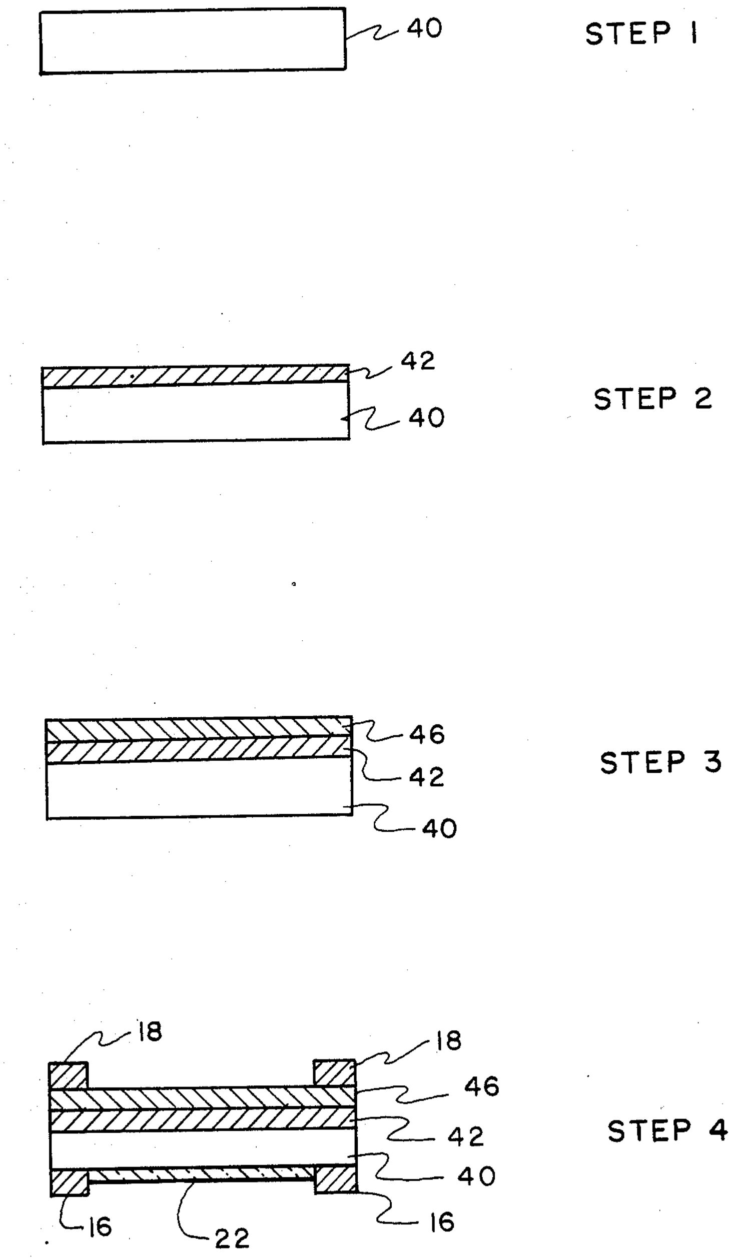
FIG. 3 shows the construction steps of forming GaAs/GaAlAs/GaP NEA photocathode.

FIG. 3 illustrates the steps in fabricating and constructing a variable sensitivity single crystal transmission mode photocathode by a liquid phase technique.

In this particular case, the insulator layer 42 and the field plate layer 40 are of different composition.

In step 1, a single crystal (111B) oriented Zinc-doped GaP seed crystal 40 which is about 15 mils thick is prepared for epitaxial growth. In step 2, a high resistivity semi-insulating layer of GaAlAs 42 one micron thick is grown by liquid epitaxy onto seed crystal 40 using a sliding boat technique. In step 3, a photoemitting layer of Zinc-doped GaAs 46 about one micron thick is grown by liquid epitaxy onto layer 42 also using a sliding boat technique.

In step 4, the appropriate contact rings 18 and 16 are connected respectively to layers 46 and 40 and an antireflection coating 22 is coated on layer 40.

A variable sensitivity photocathode may be formed in which the steps do not include eptiaxial growth techniques. In the first step, a (100) oriented p-doped ($5\times10^{17}cm^{-3}$) Silicon single crystal wafer is polished chemically or chemically-mechanically to a thickness of about 0.5 to 1.0 mil. In step 2, the wafer is thermally oxidized using a dry Oxygen technique and the resulting 0.2 micron thick $SiO_2$ layer which covers the entire wafer is removed from one surface in a buffered HF chemical etch so that an oxide layer is left only on one surface of the wafer. In step 3, a Molybdenum transparent electrode is deposited onto the oxide layer. Suitable contact rings and an antireflection coating are then applied to complete the photocathode structure.

While certain preferred embodiments and processes have been disclosed, it will be apparent to those skilled in the art that variations in the specific details which have been described and illustrated may be resorted to without departing from the spirit and scope of the invention as defined in the appended claims.

We claim:

1. A method of forming a variable photosensitivity transmission mode negative electron affinity photocathode for varying the luminous sensitivity about the white and monochromatic light wavelengths by varying the backsurface recombination velocity in said photocathode, the steps of forming said photocathode comprising:
   - providing a large bandgap single crystal transparent window substrate having an epitaxially grown wide bandgap semiconductor window layer thereon containing sufficient chromium or oxygen therein so as to be semi-insulating;
   - epitaxially growing a photoemitter layer on said semiinsulating window layer;
   - layering electrical contact rings on the outer peripheries of said photoemitter layer and said transparent window substrate;
   - applying an antireflection coating on the back of said transparent window substrate to reduce the amount of reflected light from the photon receiving side of said photocathode;
   - activating said photoemitter layer to bring about a condition of negative electron affinity; and
   - biasing said photocathode into operation by applying a bias supply voltage to said electrical contact rings to modulate an electric field effect in said photocathode.

2. A method as set forth in claim 1 wherein said step of providing a large bandgap single crystal transparent window substrate having a wide bandgap semi-insulating window layer thereon is comprised of providing a single crystal seed substrate and epitaxially growing a conductor layer on said seed substrate followed by a step of epitaxially growing a high resistivity semi-insulating layer for providing a transparent conductor-insulator combination wherein the transparent conductor acts as a field plate and the transparent insulator acts as the dielectric material through which the electric field is applied and removing at least a portion of said seed substrate if it is not transparent to the wavelength of interest to define an active window area.

3. A method as set forth in claim 2 wherein said step of providing a transparent window substrate is comprised of providing a (100)-oriented GaAs single crystal seed substrate of about 15 mils thickness which is p-doped with Zinc to $5\times10^{18}$ carriers $cm^{-3}$ and is polished on the growth surface with a $5H_2SO_4:1H_2O_2:1H_2O$ etch to remove work damage, epitaxially growing a GaP conductor layer on said GaAs single crystal seed substrate using a HCl-Ga-$PH_3$-$H_2$ vapor process, epitaxially growing an approximately 0.5 micron thich Oxygen or Chromium doped high resistivity ($\geqq 10^{10}$ ohm-cm) GaP semi-insulating layer using the HCl-Ga-$PH_3$-$H_2$ vapor process, and removing at least a portion of said GaAs single crystal seed substrate thereby exposing a portion of said GaP conductor layer, whereby to define an active window area, wherein said step of applying an antireflection coating is comprised of coating said exposed portion of said GaP conductor layer, wherein said step of epitaxially growing a photoemitter layer is comprised of growing a p-type Zinc-doped to $5\times10^{18}$ carriers $cm^3$ approximately one micron thick GaAs photoemitting layer onto said GaP semi-insulating layer using a HCl-Ga-$AsH_3$-$H_2$ vapor process in which the GaP substrate and the GaAs photoemitter layer provide a broad ban response to about 0.93 microns with a short wavelength cutoff of about 0.56 microns, and wherein said step of activating said photoemitter layer is comprised of heating said GaAs photoemitter layer to approximately 610° C. in vacuum to clean its surface and activating said photoemitter layer with layers of Cesium and Oxygen to bring about a condition of negative electron affinity.

4. A method as set forth in claim 3 wherein said step of epitaxially growing a photoemitter layer is further comprised of incorporating Indium therein to form a lower bandgap GaInAs ternary emitting layer to extend the long wavelength response beyond 0.93 microns.

5. A method as set forth in claim 1 wherein said step of providing a large bandgap single crystal transparent window substrate is comprised of preparing a single crystal (111B) oriented p-type Zinc-doped GaP conductor seed crystal of about 15 mils thickness for epitaxial growth and epitaxially growing a high resistivity semi-insulating layer of GaAlAs to about one micron thickness by liquid phase epitaxy onto said GaP conductive seed crystal by using a sliding boat technique for providing a transparent conductor-insulator combination, and wherein the further step of epitaxially growing a photoemitter layer on said transparent window substrate is comprised of growing a p-type Zinc-doped GaAs photoemitter layer of about one micron thickness by liquid phase epitaxy onto said semi-insulating layer using a sliding boat technique.

* * * * *